United States Patent [19]

Wright

[11] Patent Number: 4,733,216

[45] Date of Patent: Mar. 22, 1988

[54] N+1 BIT RESOLUTION FROM AN N BIT A/D CONVERTER

[75] Inventor: Danny O. Wright, Grafton, Va.

[73] Assignee: Allied Corporation, Morris Township, Morris County, N.J.

[21] Appl. No.: 925,031

[22] Filed: Oct. 29, 1986

[51] Int. Cl.[4] .............................................. H03M 1/12
[52] U.S. Cl. ............................................. 340/347 AD
[58] Field of Search ................................. 340/347 AD

[56] References Cited

U.S. PATENT DOCUMENTS 4,244,004 1/1981 Yamada .................... 340/347 AD X
4,558,303 12/1985 Fielden ......................... 340/347 AD Primary Examiner—William M. Shoop, Jr.
Assistant Examiner—Richard K. Blum
Attorney, Agent, or Firm—Russel C. Wells; Markell Seitzman

[57] ABSTRACT

In microprocessor based control systems wherein several analog sensors are used to generate control signals of N bits, the system herein generates a digital signal having an N+1 bit resolution of the information. The N+1 bit resolution is generated from an N bit A/D converter by means of a network changing the reference voltage input to the A/D converter by an offset voltage which is a function of the least significant bit position. The network, in the absence of a control signal, generates a first range of reference voltages and in the presence of the control signal generates a second range wherein the limit voltages are changed by the offset voltage. The microprocessor reads and stores each N bit digital word from the same sensor and under the command of the control signal, sums the two digital words and the result is an N+1 bit digital word.

5 Claims, 3 Drawing Figures

N+1 BIT RESOLUTION FROM AN N BIT A/D CONVERTER

FIELD OF INVENTION

This invention relates to digital computing systems in general and in particular to to a system for generating an N+1 bit resolution from an N bit A/D converter for use by a microprocessor.

BACKGROUND OF THE INVENTION

In microprocessor control systems as used in motor vehicles for the control of engine operations and control of the engine itself, many of the sensors used generate an analog output signal. Since most microprocessors are digital devices, the analog signals must be converted to digital signals. The device for doing such conversion is an analog to digital, A/D, converter.

One such microprocessor control system is described in U.S. Pat. No. 4,556,943 issued to Pauwels et al. on Dec. 3, 1985 entitled "Multiprocessing Microprocessor Based Engine Control System for an Internal Combustion Engine" and assigned to a common assignee. In that system the various sensors are connected to an A/D converter and its output is connected to one of the microprocessors. In that system the sensor signals are converted to eight bit digital words for use by the microprocessor and the resulting resolution is only eight bits.

It is a principal advantage of the present system to increase the resolution of digital words by creating an additional bit of Least Significiant Bit (LSB) information. It is a further advantage to create an additional bit of least significant bit (LSB) resolution upon demand of the microprocessor.

SUMMARY OF INVENTION

A system for generating an N+1 bit resolution from an N bit A/D converter having a control means for generating both a first control signal and a conversion signal for activating an A/D converter having at least two voltage level reference inputs for setting the range of the input analog signal to the converter. The A/D converter is adapted to receive the conversion signal and convert the input analog signal to an N bit digital word. A network means provides a voltage value to the two voltage level reference inputs of the A/D converter and is operable to shift each voltage value by an identical offset voltage value. A logic control means responds to the control signal causing the network means to shift each voltage value by an identical offset voltage value. The digital words of N bits from the A/D converter are supplied to a microprocessor and in response to the control signal, are added together to get a new digital word of N+1 bit resolution.

Many other objects and purposes of the invention will be clear from the following detailed description of the drawings.

DETAILED DESCRIPTION OF THE PREFERRED EMBODIMENT

Figure 1:
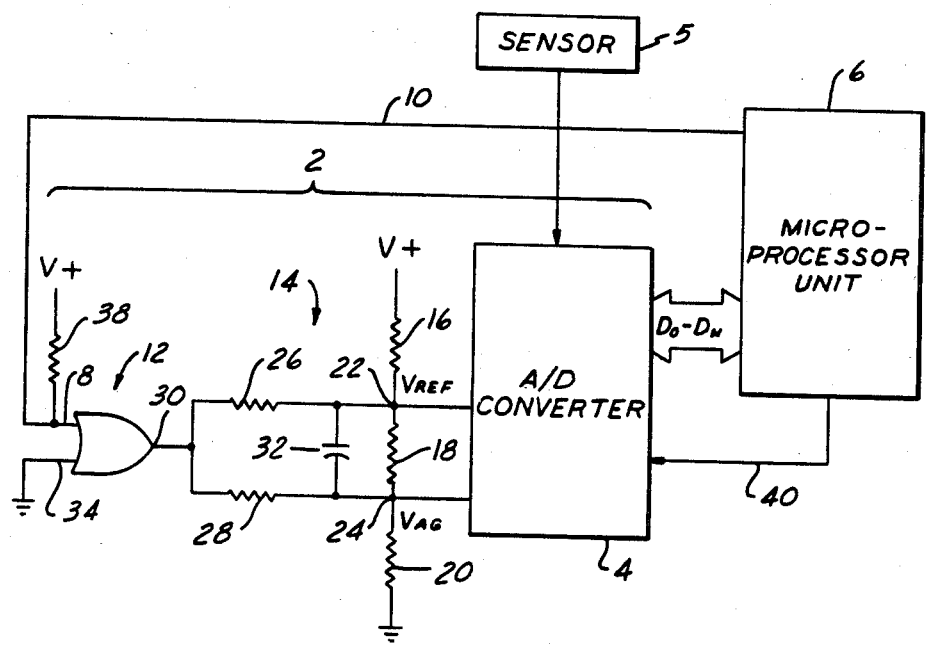
FIG. 1 is a schematic of the system for an N+1 bit resolution from an N bit digital word A/D converter.

Referring to FIG. 1, the system for generating an N+1 bit resolution of an N bit digital word is illustrated. Such a system may be use in the microprocessor based control system as described in U.S. Pat. No. 4,556,943 issued to Pauwels et al. on Dec. 3, 1985 entitled "Multiprocessing Microprocessor Based Engine Control System for an Internal Combustion Engine" which is incorporated herein by reference.

In such a system, the resolution system 2 of the preferred embodiment may be used. The A/D converter 4 supplies digital words of information from the various sensors 5 to a control means or the microprocessor 6. The system 2 herein includes a control signal input 8 for receiving a control signal 10 from the control means or microprocessor 6, logic control means 12, network means 14, and an A/D converter 4.

The A/D converter 4 may be one such as Motorola 14442 which has two reference ports identified as high voltage reference port, $V_{REF}$ and a low voltage reference port, $V_{AG}$. The function of these ports is to identify the range of the input signal which is to be converted. The outputs, $D_O-D_N$, of the A/D converter 4 are connected to the microprocessor 6.

Connected to the two reference ports $V_{REF}$ and $V_{AG}$ is a resistance network 14 having two values of resistors, R1 and R2 arranged to provide the proper voltage value range, and offset values as will hereinafter be explained, to the A/D converter 4. In the particular embodiment shown, the reistance network 14 has a three resistors 16, 18, 20, connected in series across the voltage supply. The first resistor 16 is connected to V+ and the third resistor 20 is connected to ground. Both resistors 16, 20, have the value of R2 and the second or middle resistor 18 has the value of R1. Connected to the terminals 22, 24, of the second resistor 18 are fourth the fifth resistors 26, 28, having the value of R1. The opposite ends of these resistors 26, 28, are connected together and to the output 30 of the logic network 12. A capacitor 32 may be connected in parallel with the second resistor 18 to lower the Thevenin impedance of the resistance network 14 as seen by the A/D converter 4. This is just one of a many different types of networks which may be used as the resistance network 14. Another such network may well be a plurality of amplifiers. The resistance network 14 criteria is to provide the upper and lower voltage levels of the analog signal input and to offset each level by the exactly the same voltage value upon command. The network must operate to provide a symetrical offset voltage to each reference input of the A/D converter.

As illustrated in FIG. 1, the logic network 12 is a two input OR gate having one input 34 connected to ground and the control signal input 8 connected to a control output from the microprocessor 6. The purpose of the control signal 10 is shift the input levels of the A/D converter 4 only at those times when the microprocessor 6 calls for one more bit resolution of the analog input signal to the A/D convertr 4. In the preferred embodiment, the control signal input 8 has a pull-up resistor 38 connected to the V+ of the voltage supply.

In the operation of the preferred embodiment, the output of the A/D converter 4 is an eight bit digital word. The A/D converter is addressed by a conversion signal 40 from the microprocessor 6 for each time the conversion is to be made. Once the conversion is called for, the output of the A/D converter 4 is supplied to the microprocessor 6 and stored in a byte size register for further processing.

Figure 2:
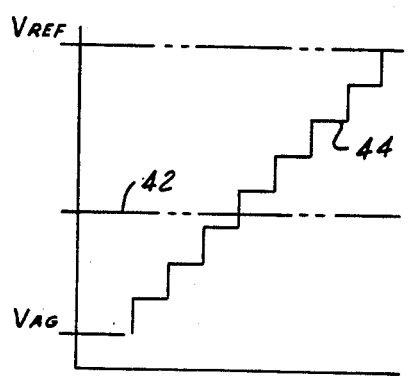
FIG. 2 is a graphic example of the operation of the system prior to offsetting the A/D converter.
Figure 3:
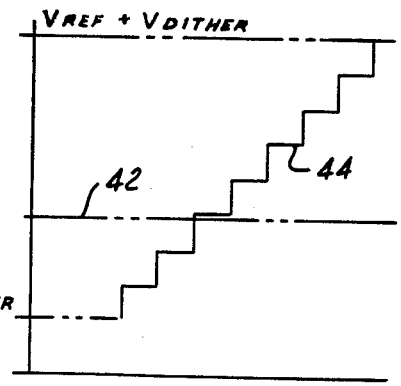
FIG. 3 is a graphic example of the operation of the stystem after offsetting the A/D converter.

When the microprocessor 6 wants the nine bit resolution, the A/D converter 4 is addressed twice and each conversion is supplied to a byte size register. The microprocessor 6 then adds together each register and the resulting sum is an nine bit digital word. On the second addressing of the A/D converter 4, the results of the conversion is either the same or differs by one bit. This is illustrated graphically in FIGS. 2 AND 3. In the FIG. 2, the first addressing of the A/D converter 4 is illustrated. The horizontal line 42 on both FIGS. 2 and 3 represents the analog voltage from the sensor 5 and is applied to the input of the A/D converter. This voltage lies between the $V_{REF}$ and the $V_{AG}$ input levels of the A/D converter 4. The staircase 44 is just a tool to show the operation of the A/D converter 4 in performing the conversion.

In FIG. 3, the voltages to the $V_{REF}$ and the $V_{AG}$ inputs have been offset by the same amount, $V_{"dither"}$. The staircase 44 has been, in essence shifted and the horizontal voltage line 42 now crosses a different "riser" on the staircase 44. It must be realized that the when the staircase 44 is shifted, the horizontal voltage line 42 may still cross the same "riser", in which case the digital output word is the same. This is an example of the voltage $V_{"dither"}$ being added to the reference voltages. It is obvious that the voltage $V_{"dither"}$ may be subtracted from the reference voltages.

In order to get the ninth bit of resolution, the "dither" voltage of weight $\frac{1}{2}$ LSB is applied to offset the $V_{REF}$ and $V_{AG}$ inputs. In order to do this the output 30 of the logic network 12 switches between the V+ and ground of the voltage supply. The microprocessor control signal 10 applied to the control signal input 8 of the logic gate controls the switching of the gate to effect the offsetting of the A/D reference voltage level inputs by either a high or low "dither". It is to be understood that the dither voltage is only in one direction, either additive or subtractive. The direction is detailed by the system designer and the logic control 12 and resistance network 14 is designed accordingly.

In the present embodiment, the ratio of the resistor values R1 and R2 is selected to provide a voltage change at the inputs $V_{REF}$, $V_{AG}$, of the A/D converter 4 wherein $$V_{"dither"} = (V+)/2^{(N+1)}$$

where N=the numbers of bits of normal resolution of the A/D converter.
Thus, if V+ =five volts and the A/D converter is an eight bit converter, $$V_{"dither"} = 5/2^{(8+1)}$$
$$= 5/2^9$$
$$= 9.77 \text{ millivolts}$$

The control signal 10 will command two conversions, basically will demand the second conversion since the steady state condition is the first or normal single conversion. The second conversion is having the voltage levels offset with the "dither" voltage either added or substracted. The summation of the two conversions in the microprocessor 6 under the control of the microprocessor 6 results in a digital word value with increased resolution of the bit in the LSB position. In this manner the eight bit A/D converter 4 under the control of the microprocessor 6 will provide nine bits of resolution for processing in the microprocessor 6.

The system 2 is but one system for performing a method of N+1 bit resolution from an N bit A/D converter. The method comprises the steps of generating a conversion signal from a control means or a microprocessor to initiate the conversion of an N bit digital word by an A/D converter. The A/D converter generates a first N bit digital word from an analog signal. The control means then generates a control signal indicating that an N+1 bit digital word resolution is to be generated therein. In response to the control signal, the network means generates an electrical signal according to the following formula $$V_{"dither"} = (V+)/2^{(N+1)}$$

where N=the number of bits of normal resolution of the A/D converter; and applies the electrical signal to the A/D converter to shift the input range of the analog signal. In response to the control signal and the conversion signal from the control means, the A/D converter generates a second N bit digital word from the analog signal in the A/D converter. The next step is to sum the first and second N bit digital words in the microprocessor to get an N+1 bit digital word.

Many changes and modifications in the above described embodiment of the invention can, of course, be carried out without departing from the scope thereof. Accordingly, that scope is intended to be limited only by the scope of the appended claims.

What is claimed is:

1. A system for generating an N+1 bit resolution from an N bit A/D converter, said system comprising:
   microprocessor means for generating a first control signal and a conversion signal;
   an A/D converter having at least two voltage level reference inputs for setting the range of the input analog signal to said converter, said A/D converter adapted to receive said conversion signal for converting the input analog signal to a first N bit digital word;
   network means for providing a normal voltage value to said at least two voltage level reference inputs and operable for shifting each normal voltage value by a symetrical offset voltage value;
   logic control means responsive to said control signal to cause said network means to shift each voltage value said symetrical offset voltage value to generate a second N bit digital word;
   means in said microprocessor means responsive to the generation of said control signal and said first and second N bit digital words for adding said words and creating an additional bit in the least significant bit position thereby forming an N+1 bit digital word wherein the least significant bit position resolution has been increased.

2. A system for generating an N+1 bit resolution from an N bit A/D converter according to claim 1 wherein said network means is a sysmetrical resistance network.

3. A system for generating an N+1 bit resolution from an N bit A/D converter according to claim 1 wherein said offset voltage is defined as:

$$V_{"dither"} = (V+)/2^{(N+1)}$$

where N=the numbers of bits of normal resolution of the A/D converter where V+ =the numerically high voltage reference to the A/D converter.

4. A method of generating an N+1 bit resolution from an N bit A/D converter comprising the steps of:
   generating a conversion signal from a microprocessor to initiate the conversion of an analog signal to a digital word by the A/D converter;
   generating a first N bit digital word from the analog signal in the A/D converter;
   generating a control signal from the microprocessor indicating that an N+1 bit digital word resolution is to be generated;
   responding to said control signal to generate an electrical signal according to the following formula $$V\text{"dither"} = (V+)/2^{(N+1)}$$

where N=the number of bits of normal resolution of the A/D converter; where V+ =the high voltage reference to the A/D converter
      applying said electrical signal to the A/D converter to shift the input range of the analog signal;
      generating a second N bit digital word from the analog signal in the A/D converter; and then
      summing the first and second N bit digital words in the microprocessor to get an N+1 bit digital word wherein the least significant bit position resolution has been increased.

5. A system for generating an N+1 bit resolution from an N bit A/D converter, said system comprising:
   control means for generating a control signal;
   a logic circuit means including a resistance circuit means having a plurality of resistances of either of two values, said resistance circuit for supplying two different voltages and responsive to said control signal for generating two offset symetrical voltages to be added to said two different voltages;
   an A/D converter adapted to receive said two different voltages for identifying the range of the analog signal to be converted into a first digital word of N bits and in response to said control signal to receive said two offset symetrical voltages added to said two different voltages for identifying the second range of the analog signal to be converted into a second digital word of N bits; and
   a microprocessor means responsive to said A/D converter signals for summing said first and second digital words into an N+1 digital word wherein the least significant bit position resolution has been increased.

* * * * *